United States Patent [19]

Okuda et al.

[11] Patent Number: 4,899,145
[45] Date of Patent: Feb. 6, 1990

[54] ENCODER AND METHOD OF ADJUSTING MAGNETIC FIELDS OF THE SAME

[75] Inventors: Hironori Okuda, Kobe; Takashi Matsubara, Nishinomiya, both of Japan

[73] Assignee: Shin Meiwa Industry Co., Ltd., Hyogo, Japan

[21] Appl. No.: 878,659

[22] Filed: Jun. 26, 1986

[30] Foreign Application Priority Data

Jul. 3, 1985 [JP] Japan .................................. 60-148476
Aug. 6, 1985 [JP] Japan .................................. 60-173926
Mar. 31, 1986 [JP] Japan .................................. 61-074933

[51] Int. Cl.$^4$ ............................................. H03M 1/22
[52] U.S. Cl. .................................... 341/15; 341/171
[58] Field of Search ...................... 340/347 P, 347 M; 335/289; 324/173, 174, 178, 179, 173, 207, 208; 364/562; 341/15

[56] References Cited

U.S. PATENT DOCUMENTS 3,268,887 8/1966 Sullivan ........................... 340/347 P
4,156,467 5/1979 Patton et al. .................... 364/562 X

OTHER PUBLICATIONS

Kaneo Mohri and Shigeru Korekoda, "New Force Transducers Using Amorphous Ribbon Cores," *IEEE Transactions on Magnetics*, vol. Mag.-14, No. 5, Sep. 5, 1978, pp. 1071-1075.

Primary Examiner—William M. Shoop, Jr.
Assistant Examiner—Brian Young
Attorney, Agent, or Firm—Lowe, Price, LeBlanc, Becker & Shur

[57] ABSTRACT

A rotary encoder comprises a rotator having ring-shaped multipole magnet and stator having magnetic field detecting sensors concentrically provided with the ring-shaped multipole magnet. The stator is provided with a plurality of zero-magnetostrictive amorphous ferromagnetic cores arrayed in correspondence to the magnetic pole pitch of the multipole magnet. Rotation angles of the rotor are detected by coils extended across the plurality of amorphous magnetic cores to be magnetically coupled with the same.

24 Claims, 13 Drawing Sheets (a)

(b)

(a)

(b)

ENCODER AND METHOD OF ADJUSTING MAGNETIC FIELDS OF THE SAME

BACKGROUND OF THE INVENTION

Field of the Invention

The present invention relates to an encoder and a method of adjusting magnetic fields of the same, and more particularly, it relates to a magnetic encoder which can obtain detection output of high resolution with relatively simple structure.

In an automatic control system, various position sensors and rotation angle sensors are employed in order to obtain position feedback signals and the like. Such sensors are prepared as a rotary encoder, a linear encoder, a synchronous sensor, a resolver and the like. Within these sensors, the rotary encoder is widely used for detecting arm positions in an industrial robot and pivot positions in an NC machine tool.

As is well known in the art, there have been provided optical type and magnetic type as rotary encoders, and the magnetic rotary encoders classified into gear type and drum type ones. In these encoders the optical rotary encoder can be improved in resolution by reducing slits provided on a rotating panel in width and array pitch. However, since the slits are limited in manufacturing accuracy, the improvement in resolution is restructed. Further, misalignment etc. may be caused between the rotating panel and a fixed panel by temperature increase, whereby the improvement in resolution is restricted.

On the other hand, a gear type magnetic rotary encoder can be manufactured at a low cost. However, when the gear is low in manufacturing accuracy of tooth profiles, the teeth are not uniform in configuration and hence tooth pitches cannot be improved in accuracy. Thus, the resolution is restricted also in the gear type encoder.

Description is now made of a drum type encoder. FIG. 1 is a conceptual diagram showing a conventional drum type encoder. Referring to FIG. 1, the drum type encoder comprises a drum 1 fixed to a rotary shaft (not shown) and a magnetic sensor such as a magneto-resistance dropping device 2 provided so as to face the surface of the drum 1 across an appropriate gap g. The outer peripheral portion of the drum 1 is so magnetized that magnetic poles N and S are alternately arrayed along the circumferential direction. Upon rotation of the drum 1, therefore, the magneto-resistance dropping device 2 outputs a pulse train in a cycle corresponding to the array pitch of the magnetic poles. Thus, the pulses are counted to obtain detecting output expressing the angle of rotation of the drum 1.

In such a drum type encoder, resolution is improved by reducing the array pitch of the magnetic poles N and S. However, following the reduction in the array pitch of the magnetic poles, an effective distrubution range d of magnetic fluxes $\phi$ is decreased in the radial direction of the drum 1 as shown at FIG. 2 (a) and (b). Therefore, the gap g between the magneto-resistance dropping device 2 and the magnetized surface of the drum 1 must be reduced in order to improve resolution. However, when the gap g is excessively reduced, relative errors ($\Delta g/g$) are considerably increased even if the gap g is in a small error $\Delta g$. Thus, small variations in the gap g lead to relatively large variations in detection output of the encoder, to lower detection accuracy.

Thus, the conventional encoders are restricted in formation of slits and tooth profiles and subdivision of magnetization, and hence proposed is improvement not in mechanical structure but in signal processing. Such improvement is disclosed in, e.g., Japanese Patent Laying-Open Gazettes Nos. 58-85113(1983) and 59-211822(1984), in which data obtained from encoders are further subdivided by an interpolation method to provide detecting output of high resolution.

However, extremely high resolution cannot be attained only by the said improvement in signal processing, but improvement in mechanical structure is required. Description is now made of such a case.

In most of conventional industrial robots and various machine tools, driving force from a motor is supplied to arms and pivots through a decelerator. A rotary encoder is coupled with the motor to obtain positional data on the arms and pivots by detecting rotation angles of the motor. When errors are caused in detection of the rotation angle of the motor, the values of the errors are multiplied by the moderating ratio of the decelerator to provide errors in positions of the arms and pivots. Needless to say, the moderating ratio is smaller than one. Therefore, the positional errors in the arms and pivots are smaller than the errors in the encoder, and hence the detection errors of the encoder substantially exert no bad influence on a control system.

However, increasingly employed in recent years are a decelerator having a moderating ratio approximate to one and a motor requiring no decelerator such as a direct-drive motor. In such case, detection errors in an encoder directly become positional errors in arms and pivots. Thus, awaited is provision of an encoder which can mechanically attain high resolution.

For example, resolution higher than 1,000,000 pulse/-rev. is required in an industrial robot employing a direct-drive motor. However, an encoder of such high resolution is expensive and the absolute accuracy thereof is not sufficient for practical use due to the various dificulties as hereinabove described. Therefore, a high-priced synchronous resolver is generally employed in such an industrial robot.

Description is now made on magnetic field adjustment in the magnetic encoder. In the magnetic encoder, magnetic fields generated in, e.g., a rotor side of a motor are detected by magnetic sensors provided in a stator side. The magnetic sensors are in intrinsic detection characteristics responsive to the types thereof, in which detection characteristics are linear only within a range of specific magnetic field strength. Rotation angles can be correctly detected by detecting the magnetic fields under such condition that strength of the magnetic fields in the positions in which the magnetic sensors are arrayed is in regions with such high linearity. Thus, magnetic field adjustment is required in the magnetic encoder.

When the magnetic fields are generated by magnetization as shown in FIG. 1, such magnetic field adjustment can be performed by correcting the magnetization value. When magnetic substances are magnetized through currents to detect magnetic fields thereby generated, magnetic fields can also be adjusted by correcting the current values. Magnetic field adjustment can furthr be performed by correcting assembly sizes of such magnetic field generating mechanisms and magnetic sensors.

However, particularly when magnetic fields are generated by magnetization, correction of magnetization is considerably difficult in practice since such magnetization is corrected by repeating magnetization and demagnetization. Further, assembly sizes of respective components cannot be easily corrected. Thus, such methods are not sufficiently practical.

SUMMARY OF THE INVENTION

The present invention is directed to an encoder having opposite stator and movable element to magnetically detect relative positional relation between the stator and the movable element. The encoder according to the present invention comprises multipole magnetic field generation means provided in the movable element or stator and magnetic field detecting means provided in the said stator or the said movable element facing the multipole magnetic field generating means. The said magnetic field detecting means has a plurality of magnetic cores formed by magnetic substance having magnetization characteristics with low hysteresis and arrayed at a pitch corresponding to a magnetic pole pitch of the said multipole magnetic field generating means and magnetic field detecting coils extended across respective ones of the said plurality of magnetic cores to be magnetically coupled with the same.

The present invention is futher directed to a method of adjusting magnetic fields of the said encoder. The magnetic field adjusting method comprises a first step of varying mutual distance between the said multipLle magnetic field generating means and the said magnetic field detecting means by movement in prescribed direction, a second step of observing detecting output of the said encoder after every movement of the said mutual distance, a third step of repeating the said first and second steps while varying the said mutual distance to determine the value of the said mutual distance for providing optimum magnetic fields in the position of the said magnetic field detecting means and a fourth step of fixing the mutual distance between the said multipole magnetic field generating means and the said magnetic field detecting means at the value determined in the said third step.

Accordingly, a principal object of the present invention is to provide a magnetic encoder which can obtain detecting output of high resolution without reducing a gap between stator and a movable element.

Another object of the present invention is to provide a magnetic encoder which is relatively simple in structure and at a low cost.

Still another object of the present invention is to provide a method of readily and correctly adjusting magnetic fields in a magnetic encoder.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First embodiment (A1) Structure and operation of Rotary Encoder

Figure 1:
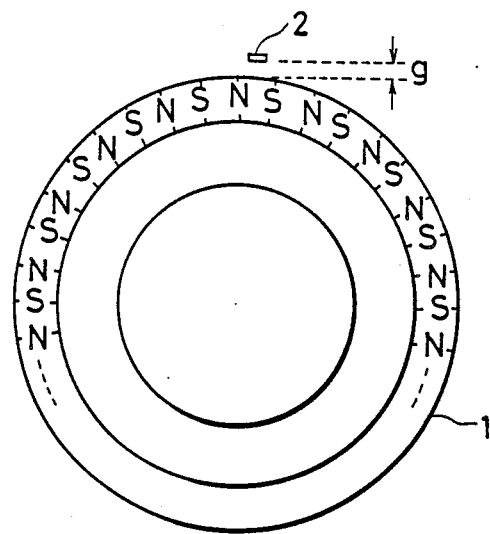
FIGS. 1 and 2 are explanatory diagrams showing as conventional rotary encoder.
Figure 2:
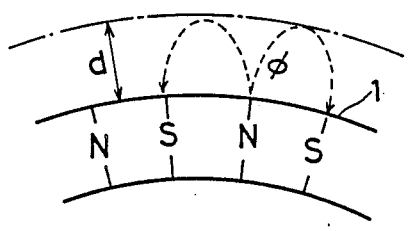
Figure 2:
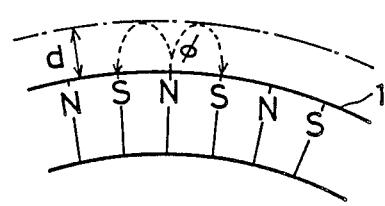
Figure 3:
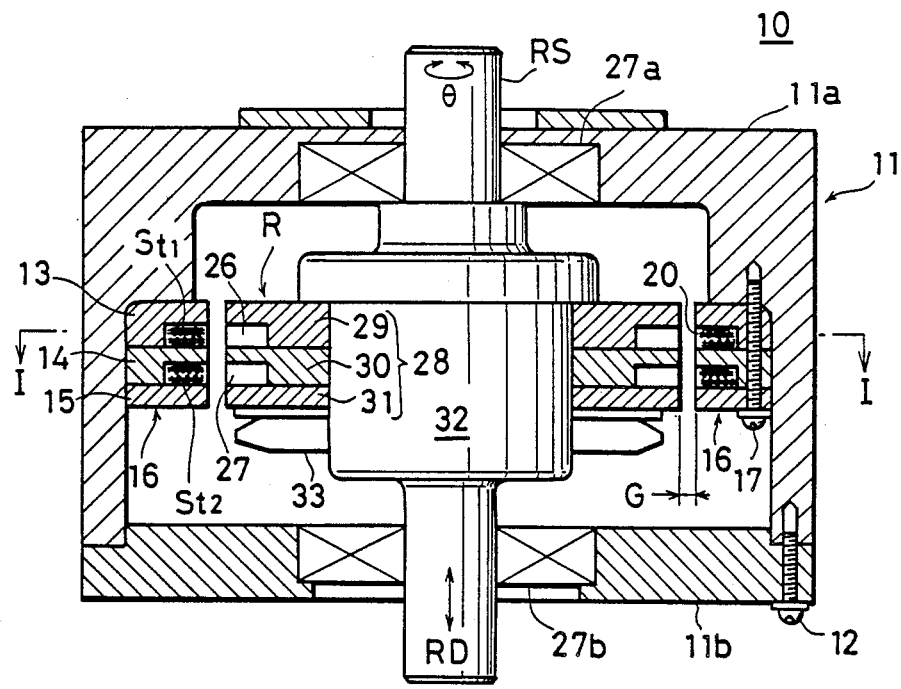
FIGS. 3 and 4 illustrate a first embodiment of the present invention.
Figure 4:
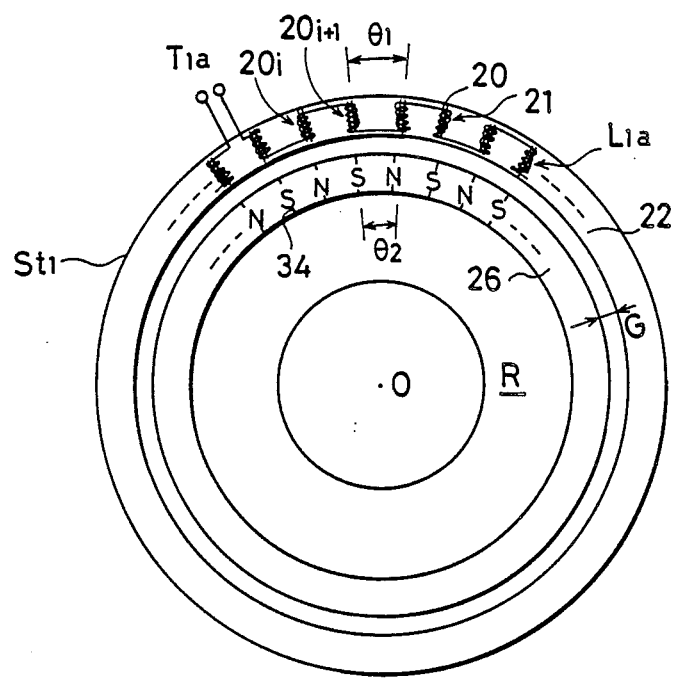

FIG. 3 is a longitudinal sectional view showing a rotary encoder 10 according to a first embodiment of the present invention, and FIG. 4 is a partially enlarged sectional view taken along the line I—I in FIG. 3. Referring to FIG. 3 and 4, the rotary encoder 10 comprises a substantially cylindrical hollow shield case 11 serving as a housing. This shield case 11 is formed by a substantially cylindrical hollow casing 11a having a fully opening bottom surface and substantially discodial lid 11b mounted on the casing 11a by a screw 12 so as to cover the opening bottom surface of the casing 11a. The shield case 11 is adapted to magnetically shield components contained therein against external magnetic fields.

The shield case 11 contains stators $S_{t1}$ and $S_{t2}$ and a rotor R serving as a movable element in positions facing each other across an gap G. As hereinafter described in detail, the rotor R has ring-shaped multipole magnets 26 and 27, to vary inductances of coils in the stators $S_{t1}$ and $S_{t2}$ by magnetic fields applied from the multipole magnets 26 and 27. Description is now made on mounting structure and internal structure of the stators $S_{t1}$ and $S_{t2}$.

A stator holder 16 formed by successively laminating two ring-shaped holders 13 and 14 having L-shaped sections and a flat ring-shaped holder 15 is fixed by a screw 17 to the shield case 11. The ring-shaped holders 13, 14 and 15 are made of resin. As obvious from FIG. 5 showing a partially fragmented sectional view, the two stators $S_{t1}$ and $S_{t2}$ are respectively provided in grooves 18 and 19 defined in the stator holder 16 by the said lamination, to be held by the stator holder 16.

Figure 5:
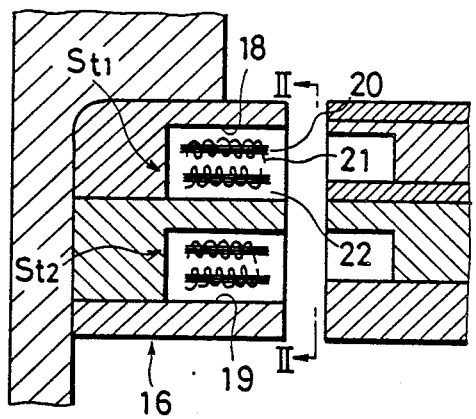
FIGS. 5, 6A, 6B, 8 and 10 are partially enlarged views of the first embodiment.
Figure 6A:
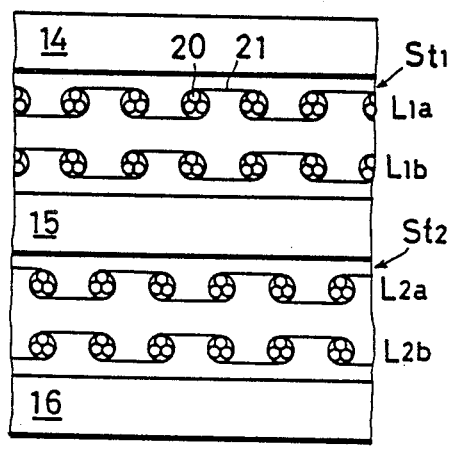
Figure 7:
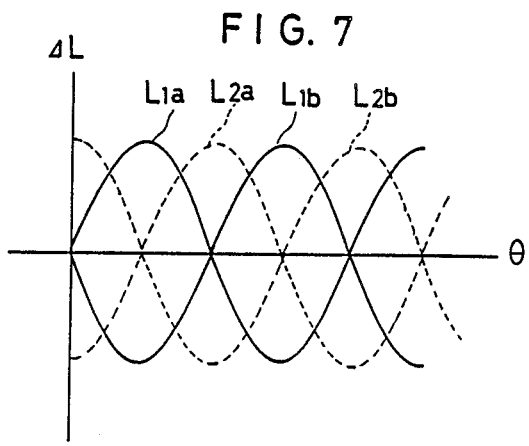
FIG. 7 illustrates inductance changes in respective coil trains.

As shown in FIGS. 4 and 5, each of the stators $S_{t1}$ and $S_{t2}$ has a plurality of magnetic cores 20 radially arrayed about the central axis 0 (FIG. 4) of rotation of the rotor R at regular intervals. For example, 100 magnetic cores 20 are provided in this embodiment, and the array angle pitch $\theta_1$ thereof is identical to the magnetic pole array angle pitch $\theta_2$ in the rotor R. The magnetic cores 20 are provided in two vertical stages for each of the stators $S_{t1}$ and $S_{t2}$, and coils 21 are wound around the respective magnetic cores 20 to be sealed by epoxy resin 22. These coils 21 are connected in series for every magnetic pole array. Thus, in total, there are four coil trains extended across the respective magnetic cores 20 to be magnetically coupled with the same. The coils 21 in the coil trains are alternately inverted in connection as shown in FIG. 4. However, the four coil trains are different in connection rule and/or array position from each other. As shown at FIG. 6A showing a sectional view taken along the line II—II of FIG. 5, the coils 21 are reversed in connection rule to each other in two coil trains $L_{1a}$ and $L_{1b}$ belonging to the stator $S_{t1}$. On the other hand, two coil trains $L_{1a}$ and $L_{2b}$ belonging to the other stator $S_{t2}$ are displaced with respect to the coil trains $L_{1a}$ and $L_{1b}$ belonging to the stator $S_{t1}$ by ½ of the array pitch of the magnetic cores 20. Therefore, when multipole magnetic fields are applied from the rotor R as hereinafter described, there are caused inductance changes 180° out of phase between the coil trains $L_{1a}$ and $L_{1b}$. In the coil trains $L_{2a}$ and $L_{2b}$, further, caused are inductance changes 90° out of phase with those between the coil trains $L_{1a}$ and $L_{1b}$. FIG. 7 shows amounts $\Delta L$ of inductance changes with respect to amounts $\theta$ of rotation of the rotor R.

The 180° out-of-phase two coil trains $L_{1a}$ and $L_{1b}$ and the other two coil trains $L_{2a}$ and $L_{2b}$ 90° out of phase therewith are provided for the following reasons: First, the 180° out-of-phase two coil trains are required for the operation of an inductance detecting circuit as hereinafter described. Second, as obvious from FIG. 7, the amounts $\Delta L$ of inductance changes with respect to the rotation angles $\theta$ are small at the positions corresponding to peaks and troughs of the inductance changes, whereby accuracy in detection of the rotation angles is lowered in the vicinity thereof. Namely, the two coil trains which are 90° out of phase with each other are complementarily employed to improve the accuracy in entire regions.

Figure 6B:
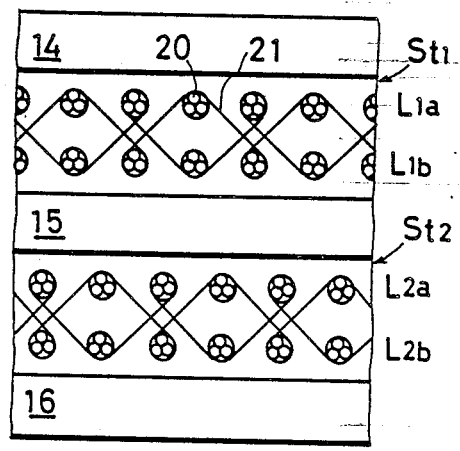

As shown at FIG. 6B, the coils 21 belonging to the upper and lower stages may be alternately connected in each of the stators $S_{t1}$ and $S_{t2}$. Such a connection method can effectively average variations in vertical distance between the coils 21 belonging to the upper and lower stages and changes therein caused by vibration upon rotation.

As shown in FIG. 4, the coil train $L_{1a}$ included in the stator $S_{t1}$ is connected through a terminal $T_{1a}$ to one of two inductance detecting circuits as hereinafter described. The other coil trains $L_{1b}$, $L_{2a}$ and $L_{2b}$ (not shown) are also connected to the said inductance detecting circuit through terminals $T_{1b}$, $T_{2a}$ and $T_{2b}$ (not shown). The rules for such connection are hereinafter described.

Figure 8:
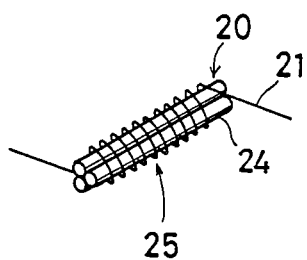
Figure 9:
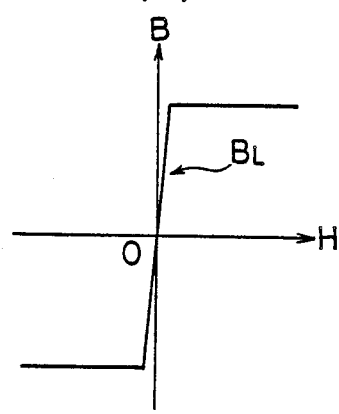
FIG. 9 shows graphs of magnetization characteristics of magnetic cores.
Figure 9:
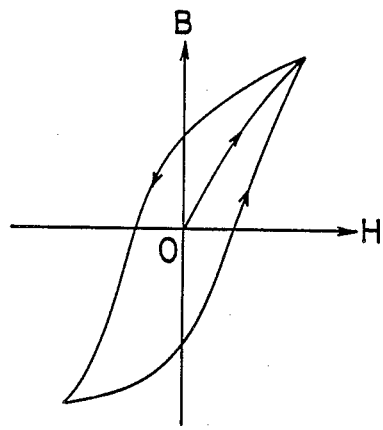

Detailed description is now made on the structure of each magnetic core 20. As shown in FIG. 8, each magnetic core 20 is formed by three element wires 24 made from zero-magnetostrictive amorphous ferromagnetic substance of, e.g., 0.1 mm in diameter and 4 mm in length. The zero-magnetostructive amouphous ferromagnetic substance has low (substantially zero) hysteresis in a magnetization process, and has a typical angular magnetization characteristic in relation between magnetic fields H and magnetic flux density B as shown at FIG. 9(a). Such a characteristic is described in, e.g., "Journal of Applied Magnetic Society of Japan" Vol. 7, No. 2. 1983, p. 143 to p. 146. Thus, in the magnetic core 20 employed in this embodiment, the magnetic flux density B is uniquely determined with respect to the magnetic fields H, differently from that of ordinary magnetic substance having large hysteresis as shown at FIG. 9(b). Further, the magnetic core 20 is extremely sharp in responsibility to changes in the magnetic fields H, while zero-point adjustment can be easily performed.

Around the magnetic core 20 thus formed, the coil 21 is wound by, e.g., about 10 times as shown in FIG. 8.

The coil is formed by, e.g., an enamel wire of 0.1 mm in diameter. Thus, the magnetic core 20 and the coil 21 form a fine and sharp magnetic field sensor 25 of about 4 mm in length and 1 mm in diameter, as shown in FIG. 8.

Description is now made of a mounting structure and internal structure of the rotor R as a movable element. As shown in FIG. 3, a rotor shaft RS made from non-magnetic substance is pivotally supported by bearings 27a and 27b in the central portion of the shield case 11. The rotor R is fixed to the rotor shaft RS. This rotor R is formed by two ring-shaped multipole magnets 26 and 27 held by a magnetic holder 28 of non-magnetic substance. The magnetic holder 28 is formed by successively laminating ring-shaped holders 29 and 30 having L-shaped sections and a substantially flat ring-shaped holder 31. The magnetic holder 28 is fixed by a nut 33 to a rotor mounting portion 32 coupled with the rotor shaft RS. The respective components of the rotor R are provided with detents (not shown).

Figure 10:
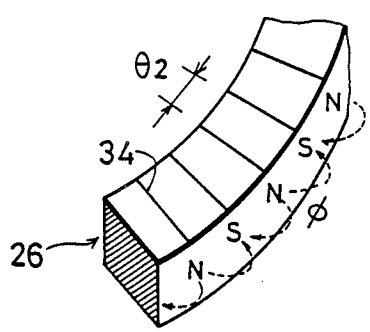

The ring-shaped multipole magnet 26 is provided in a plane perpendicular to the detection of the axis RD of rotation of the rotor R about the rotation axis 0 (FIG. 4). As shown in FIGS. 4 and 10, the ring-shaped multipole magnet 26 is so magnetized as to have magnetic poles N and S in its outer periphery successively along the circumferential direction. This magnetization is performed in such a manner that, e.g., 100 magnetic poles are provided in total along the full circumference while constantly maintaining the angle pitch $\theta_2$ between each adjacent pair of magnetic poles. It is to be noted that FIGS. 4 and 10 only partially illustrate the magnetic poles. Although lines 34 are illustrated to indicate positions of the magnetic poles in FIGS. 4 and 10, the same as imaginary lines and the ring-shaped multipole magnet 26 is not in such an external form as shown in FIGS. 4 and 10 in practice.

Such magnetization of the multipole magnet 26 causes magnetic fluxes $\phi$ as shown in FIG. 10, and the magnetic fluxes $\phi$ pass through the magnetic cores 20 as shown in FIG. 4 to return to the multipole magnet 26. Therefore, upon rotation of the rotor R, the magnetic fluxes $\phi$ passing through the coils 21 are changed to cause changes in inductances of the coils 21.

The lower multipole magnet 27 is also magnetized in a similar manner to the above, and the magnetic pole pitch and the magnetic pole array rule thereof are identical to those of the upper multipole magnet 26. Magnetic fluxes from the lower multipole magnet 27 are detected by the coils 20 included in the lower stator $S_{t2}$. The two multipole magnets 26 and 27 are magnetized in the same mode, and hence the multipole magnets 26 and 27 may be integrated in one multipole magnet. However, preferably the multipole magnets 26 and 27 are separately provided as in this embodiment, in order to prevent magnetic interference between the two stators $S_{t1}$ and $S_{t2}$.

A gap G (FIG. 3) between the multipole magnets 26 and 27 and the magnetic core 20 is so defined that magnetic fields H supplied by the magnetic fluxes $\phi$ from the multipole magnets 26 and 27 to the magnetic cores 20 are in optimum strength in relation to the magnetization characteristic of the zero-magnetostrictive amorphous ferromagnetic substance forming the magnetic cores 20. Namely, the gap G is determined so that the magnetic fields H reached to the magnetic core 20 is in the linear portion BL shown in FIG. 9(a). The optimum strength of the magnetic fields H is 10 to 20 gauss in this embodiment, and the gap G is sized to be 3 mm in order to obtain the optimum strength of the magnetic fields H.

Thus, upon rotation of the rotor R, the following changes are caused in the rotary encoder 10: When relative positional relation between the magnetic poles and the stator $S_{t1}$ is changed by rotation of the rotor R, a magnetic flux passing through a coil $21_i$ (FIG. 4) included in the stator $S_{t1}$ is changed thereby causing a change in the inductance of the coil $21_i$. Ideally the inductance change must be responsive the change in the rotation angle of the rotor R, whereas an error is caused in the inductance change in practice due to an error in the magnetizing position and manufacturing errors and assembly errors in the respective components. However, such an error is considerably small in comparison with the case of employing other ferromagnetic substance, since the magnetic cores 20 are prepared by the amorphous ferromagnetic substance.

An inductance change is also caused in a coil $21_{i+1}$ adjacent to the coil $21_i$. This inductance change also deviates from an ideal amount of change due to various errors. However, since the angle pitch $\theta_2$ of the coil array is made identical to the angle pitch $\theta_1$ of the magnetic pole array and the adjacent coils $21_i$ and $21_{i+1}$ are connected reversely to each other, the two inductance changes are in phase. When a magnetic pole N is faced to the coil $21_i$, a magnetic pole S is faced to the coil $21_{i+1}$ hence the magnetic fluxes passing through the coils $21_i$ and $21_{i+1}$ are reverse to each other. However, since the coils $21_i$ and $21_{i+1}$ are connected reversely to each other, the inductance chnges are in the same direction as the result. This also applies to the remaining coils 21 belonging to the coil train $L_{1a}$ in the stator $S_{t1}$.

Thus, all the coils 21 belonging to the coil train $L_{1a}$ are connected in series with each other, and hence the inductance change detected at the terminal $T_{1a}$ as shown in FIG. 4 is the total sum of the inductance changes of the coils 21. Therefore, the following two characteristics are derived:

First, the amount of inductance change detected at the terminal $T_{1a}$ is extremely larger than the amount of inductance change caused in each coil 21. Since this embodiment employs 100 magnetic poles 20 and 100 coils 21, the total amount of inductance change in the coil train $L_{1a}$ is about 100 times that of each coil 21, Such a large inductance change facilitates correct and easy detection of the amount of inductance change as hereinafter described.

Second, the total sum of the amount of inductance changes of the coils 21 is obtained so that the said errors in the amounts of inductance changes are cancelled with each other, whereby such errors are averaged when a detection is made at the terminal $T_{1a}$ and such errors have substantially no influence on the total inductance. Thus, the amount of inductance change detected at the terminal $T_{1a}$ correctly reflects the rotation angle $\theta$. Further, the signal-to-noise ration is remarkably improved by obtaining the total sum of inductance changes of the large number of coils.

The said two characteristics also apply to the other coil trains $L_{1b}$, $L_{2a}$ and $L_{2b}$. Namely, the amounts of inductance changes of the coils 21 belonging to the coil trains $L_{1b}$, $L_{2a}$ and $L_{2b}$ are added up to provide inductance changes of the coil trains $L_{1b}$, $L_{2a}$ and $L_{2b}$ to be detected at the terminals $T_{1b}$, $T_{2a}$ and $T_{2b}$. However, since the coils 21 in the respective coil trains are different in connection rule and/or array position from each other, the inductance changes in the respective coil trains are 90° or 180° out of phase with each other.

Thus, the inductance changes 180° or 90° out of phase with each other are observed at the terminals $T_{1a}$, $T_{1b}$, $T_{2a}$ and $T_{2b}$ of the rotary encoder 10. These inductance changes are detected by an inductance detecting circuit as hereinafter described.

(A2) Structure and Operation of Inductance Detecting Circuit

Figure 11:
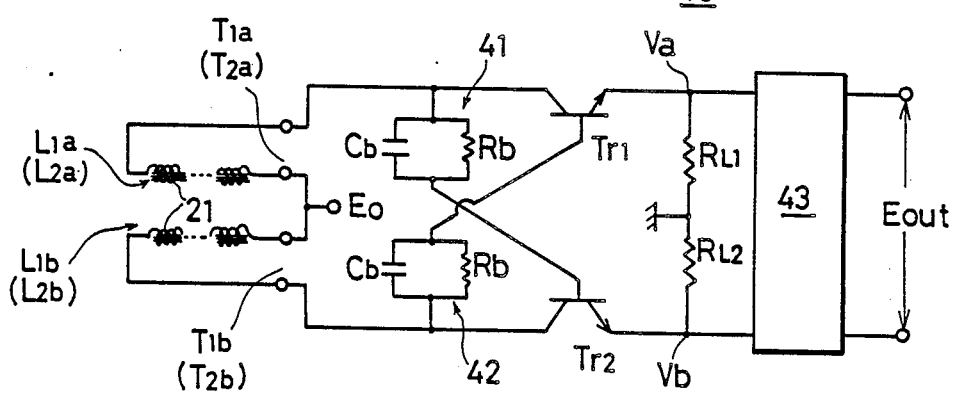
FIG. 11 is a circuit diagram showing an inductance detecting circuit.

FIG. 11 is a circuit diagram showing an exemplary construction of an inductance detecting circuit 40 for detecting the inductance changes of the coil trains $L_{1a}$, $L_{1b}$, $L_{2a}$ and $L_{2b}$ provide in the stators $S_{t1}$ and $S_{t2}$ of the rotary encoder 10. Details of such an inductance detecting circuit 40 are described in the aforementioned "Journal of Applied Magnetic Society of Japan", and hence the following description is made within a range required for understanding the present invention.

The inductance detecting circuit 40 is formed by a multivibrator bridge including bridge connection of commutation circuits 41 and 42 formed by parallel-connected capacitors Cb and resistors Rb and transistors Tr1 and Tr2. Resistors $R_{L1}$ and $R_{L2}$ are load resistors. In such a multivibrator bridge, the coil trains $L_{1a}$ and $L_{1b}$ are connected between a power supply potential $E_O$ and the commutation circuits 41 and 42 through the terminals $T_{1a}$ and $T_{1b}$ of the rotary encoder 10. There is provided another circuit (not shown) identical in structure to the inductance detecting circuit 40, so that the coil trains $L_{2a}$ and $L_{2b}$ are connected to the said another circuit through the terminals $T_{2a}$ and $T_{2b}$. The two inductance detecting circuits are absolutely identical in operation to each other except for phase difference of 90°, and hence the following description is made only with respect to the inductance detecting circuit 40.

Figure 12:
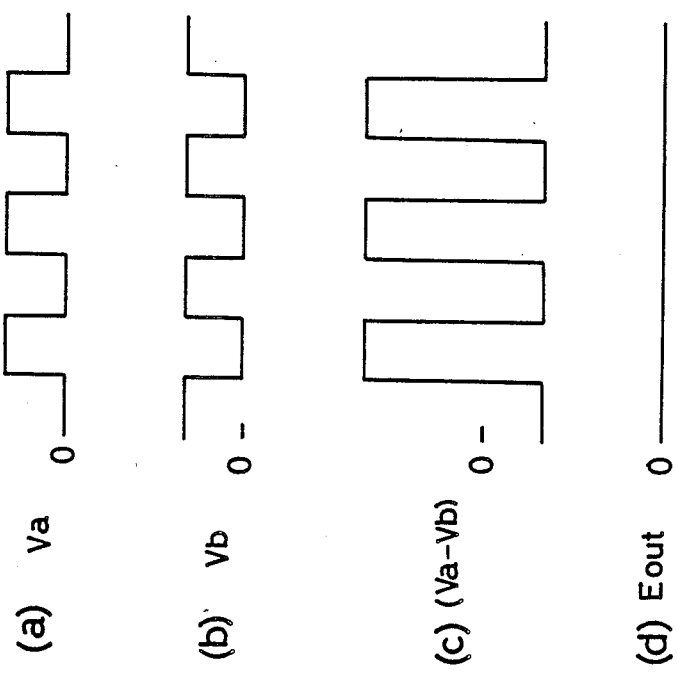

The operation of the inductance detecting circuit 40 is now described. Suppose that no magnetic field is applied from the multipole magnet 26 to the coils 21 of the stator $S_{t1}$. In this case, the coil trains $L_{1a}$ and $L_{1b}$ function as those having the same inductances. Therefore, the multivibrator bridge serves as an ordinary stable multivibrator, whereby electric potentials Va and Vb on emitter electrode sides of the transistors Tr1 and Tr2 are changed as shown at FIG. 12(a) and (b). In FIG. 12, the waveforms are qualitatively shown with omission of overshooting signal changes etc.

FIG. 12(c) shows a difference (Va−Vb) between the said two potentials Va and Vb as input in a low pass filter 43 shown in FIG. 11. FIG. 12(d) shows a DC output signal $E_{out}$ obtained by passing the difference signal (Va−Vb) through the low pass filter 43. The low pass filter 43 is adapted to remove high-frequency components from its input signal while subtracting prescribed offset voltage, whereby the output signal $E_{out}$ is at a zero level in this case.

Figure 13:
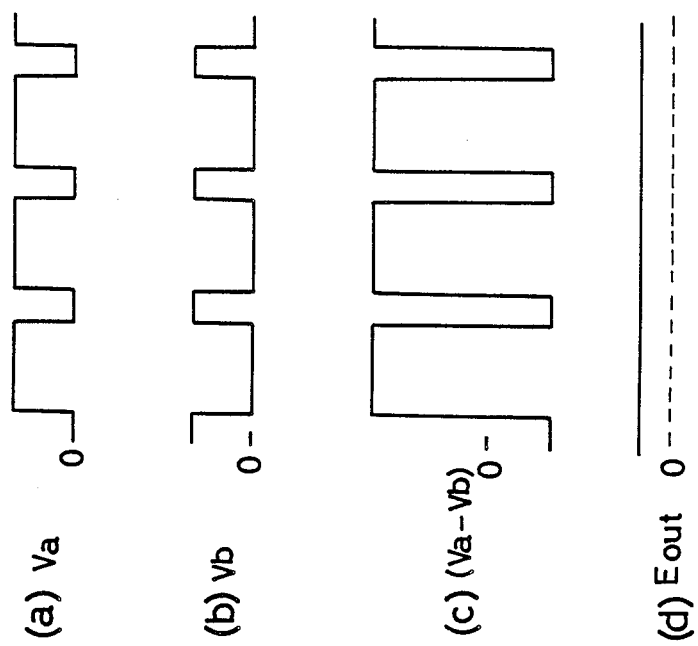
FIGS. 12 to 15 are waveform diagrams showing the operation of the inductance detecting circuit.

On the other hand, when magnetic fluxes from the multipole magnets 26 and 27 pass through the coils 21, inductances of the coil trains $L_{1a}$ and $L_{1b}$ are changed from the original values. Since the coil trains $L_{1a}$ and $L_{1b}$ are reverse in coil connection rule to each other, the amounts of inductances changes thereof are also reverse to each other. Then, commutation intervals of the multivibrator bridge are changed, whereby the potentials Va and Vb are changed as shown at FIG. 13(a) and (b) respectively. Therefore, the difference (Va−Vb) between the electric potentials Va and Vb becomes the pulse train having the waveform shown at FIG. 13(c). Thus, when the signal (Va−Vb) is supplied to the low pass filter 43, the output signal $E_{out}$ is shifted from the zero level to a DC signal as shown at FIG. 13(d). In other words, the output signal $E_{out}$ has a value responsive to the strength H of the magnetic fields passing through the coil trains $L_{1a}$ and $L_{1b}$ in detecting inductance changes thereof. Thus, relative angular relation between the rotor R and the stator $S_{t1}$ can be detected by observing the value of the output signal $E_{out}$.

Figure 14:
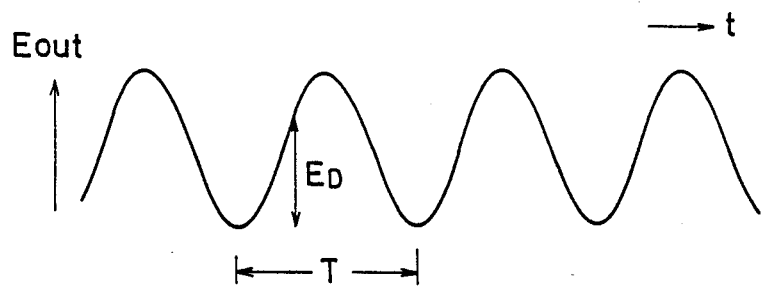

Now consider that the rotor R rotates at a constant speed. Then, the magnetic fields passing through the coils 21 are periodicaly changed, whereby the output signal $E_{out}$ is periodically changed with respect to time t as shown in FIG. 14. The period T of such signal changes is determined in response to the angular speed of rotation and the magnetic pole angle pitch $\theta_1$. Therefore, the rotation angle of the rotor R can be detected in the unit of the angle pitch $\theta_1$ by counting the number of peaks shown in FIG. 14. Within a period T, detailed angle detection is performed in a unit smaller than the angle pitch $\theta_1$ by sampling the output signal $E_{out}$ and digitalizing the same to obtain, e.g., $E_D$ in FIG. 14. In this case, accuracy lowered in the peaks and troughs in the waveform as shown in FIG. 14 can be compensated by producing a waveform 90° out of phase with that in FIG. 14 through the said other inductance detecting circuit.

(A3) Data Examples

Figure 15:
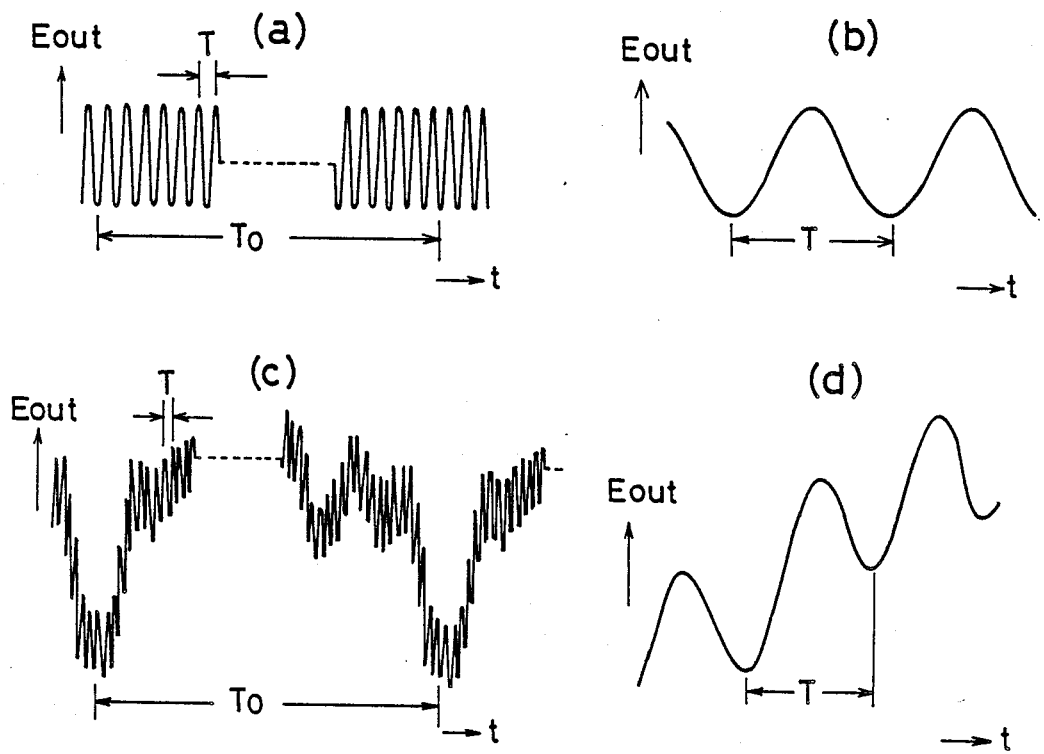

FIG. 15 illustrates examples of measured data obtained by observing the output signal $E_{out}$ upon constant-speed rotation of the rotor R by means of an oscilloscope. FIG. 15(a) shows the data with respect to the aforementioned embodiment, and FIG. 15(b) partially illustrates the data of FIG. 15(a) in enlarged time scale. As obvious from FIG. 15(a) and (b), the coil trains in this embodiment are formed to be provided with the pluralities of magnetic cores 20 to cancel errors, whereby the smooth and regular output signal $E_{out}$ can be obtained in both of the period T corresponding to the magnetic pole pitch $\theta_1$ and a period $T_O$ corresponding to one rotation cycle of the rotor R.

FIGS. 15(c) and (d) illustrate an output signal $E_{out}$ with only one magnetic core 20 and one coil 21, where output signal $E_{out}$ is in an irregular waveform in both of a magnetic pole period T and a rotation period $T_O$. Thus, according to the embodiment of the present invention, correct angle detection is achieved in a high-resolution manner.

Although the magnetic cores 20 are arrayed at the same pitch as the magnetic pole pitch $\theta_1$ in this embodiment, the same may be arrayed at any pitch on condition that the pitch is in odd number times the magnetic pole pitch $\theta_1$. However, it is to be noted that detection is most effectively performed when the said pitches are identical to each other.

(A4) Modification of First Embodiment

Figure 16:
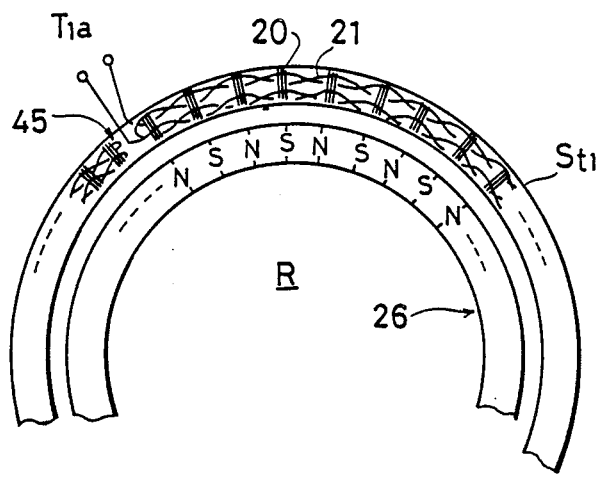
FIGS. 16 to 22 illustrate modifications of the first embodiment.

Description is now made on modifications of the first embodiment. FIG. 16 shows a first modification, in which coils 21 are wound around a magnetic core 20 in a wave-winding manner in a stator $S_{t1}$. This also applies to the other stator $S_{t2}$. As obvious from the connection path of the coils 21 as shown in FIG. 16, a conductive path formed by connection of the coils 21 is not in the form of a closed loop completely enclosing a rotor R, but is turned up at a turn-up point 45. Thus, the structure as shown in FIG. 16 is not substantially influenced by external magnetic fields etc. passing through the space defined by the rotor R.

Figure 17:
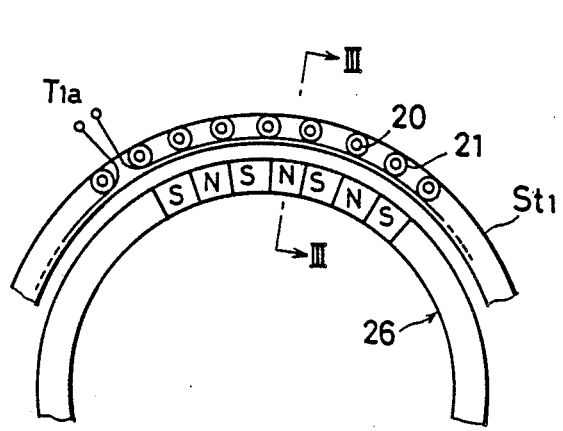
Figure 18:
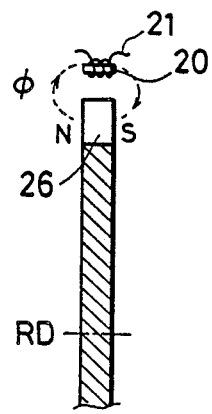

FIG. 17 shows another modification, in which a multipole magnet 26 is magnetized to be alternately provided with magnetic poles N and S in the axial direction of a rotor R, i.e., perpendicularly to this figure. Therefore, as shown in FIG. 18 as a sectional view taken along the line III—III in FIG. 17, each magnetic flux $\phi$ passes through the magnetic core 20 at a component part along the direction of the rotation axis RD of the rotor R, thereby to cause an inductance change in the coil 21.

Figure 19:
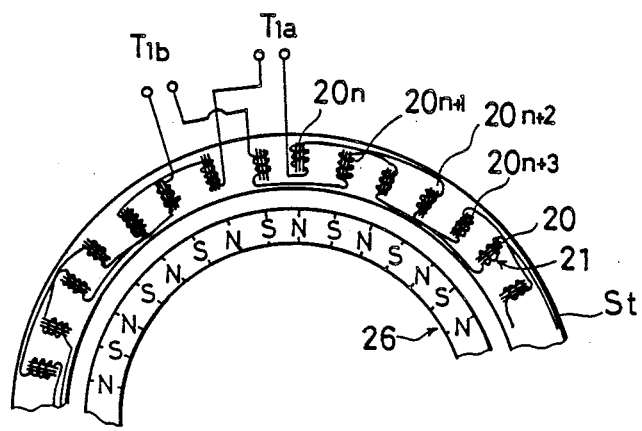

FIG. 19 shows a third modification, in which a train of magnetic cores 20 is provided in a single stator $S_t$ to detect two inductnce change amounts 180° out of phase with each other from the train of magnetic cores 20. Namely, coils 21 are wound in a clockwise direction around a pair of adjacent magnetic cores $20_n$ and $20_{n+1}$ while being unclockwisely wound around another pair of adjacent magnetic cores $20_{n+2}$ and $20_{n+3}$ in subsequent positions. The magnetic cores 20 are thus provided in the form of pairs, to wind the coils 21 in the same direction around every pair. Further, the coils 21 are alternately series-connected successively from the reverse direction to form two coil trains, thereby to connect these coil trains to terminals $T_{1a}$ and $T_{1b}$ respectively.

When a multipole magnet 26 is magnetized in a similar manner to FIG. 4, inductances of the coils 21 are changed by magnetic fluxes from the multipole magnet in an identical manner between every other magnetic core 20 (e.g., between $20_n$ and $20_{n+2}$). This is because the alternate magnetic cores 20 receive the magnetic fluxes from identically polarized magnetic poles and both of coil winding rules and connection rules are reversed in the same, whereby influences from the magnetic fluxes are exerted in the same directions. On the other hand, since every adjacent pair of magnetic cores 20 are influenced by reversely polarized magnetic poles, inductances of the coils 21 are reversely changed between adjacent magnetic cores 20 (e.g., between $20_n$ and $20_{n+1}$). For example, when the coils 21 wound around the magnetic cores $20_n$ and $20_{n+2}$ are increased in inductance, the coils 21 wound around the magnetic cores $20_{n+1}$ and $20_{n+3}$ are decreased in inductance. Thus, composite inductances 180° out of phase with each other are observed at the terminals $T_{1a}$ and $T_{1b}$ respectively. Although resolution in this modification is reduced to half that in the first embodiment, the coils 21 can be arrayed in only one train in the stator $S_t$.

Figure 20:
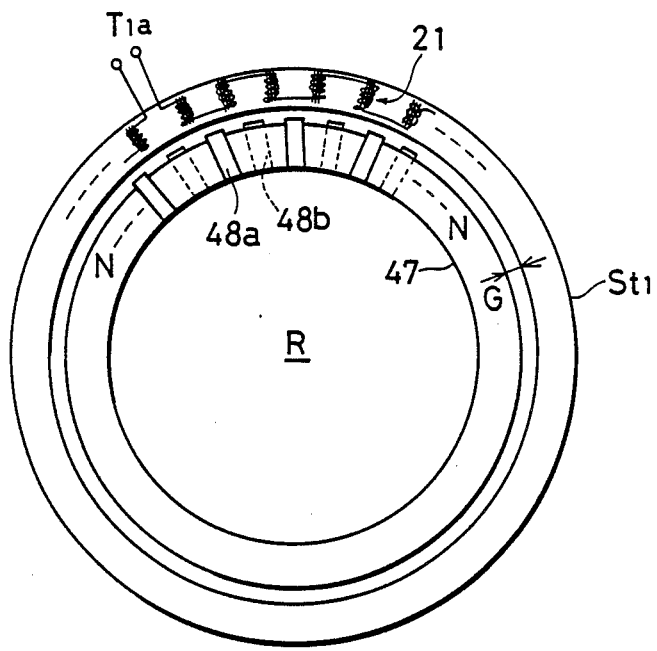
Figure 21:
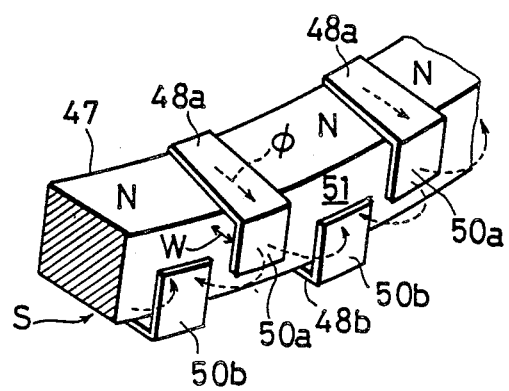

FIG. 20 shows a fourth modification, in which a ring-shaped magnet 47 magnetized to be uniformly provided with magnetic poles N and S in upper and lower surfaces thereof has L-shaped magnetic metal strips 48a and 48b alternately provided in the upper and lower surfaces, to define a multipole magnet. As shown in FIG. 21, pawls 50a and 50b of the magnetic metal strips 48a and 48b are faced to an outer peripheral surface 51 of the ring-shaped magnet 47 with a prescribed gap W. Thus, as shown in FIG. 21, magnetic fluxes $\phi$ from the upper N poles pass through the magnetic metal strips 48a to reach the pawls 50a. Then the magnetic fluxes $\phi$ reach the adjacent pawls 50b from the pawls 50a, to return to original positions through the magnetic metal strip 48b and the ring-shaped magnet 47. In this modification, rotation angle detection is performed through observation of inductance changes of the coils 21 caused by the magnetic fluxes $\phi$ passing through the coils 21 from the pawls 50a and reaching the pawls 50b.

Figure 22:
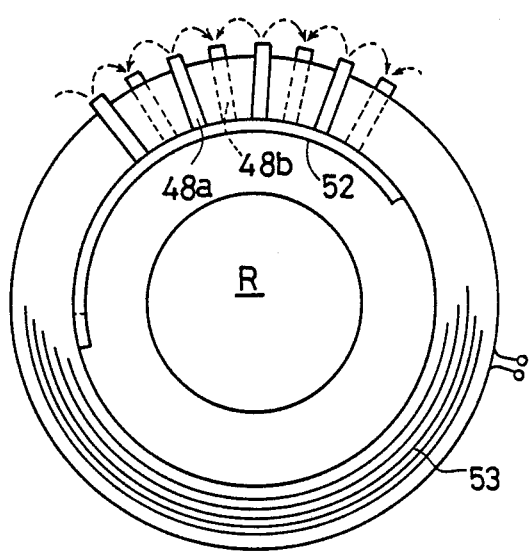

Such a modification is also applicable to magnetic field generating means formed by electromagnets. FIG. 22 shows such structure. Referring to FIG. 22, coils 53 are wound around a ring-shaped core member 52, which is provided in its upper and lower surfaces with magnetic metal strips 48a and 48b similar to those in FIG. 21. Thus realized is a function similar to that of the modification as shown in FIGS. 20 and 21.

B. Second Embodiment

Figure 23:
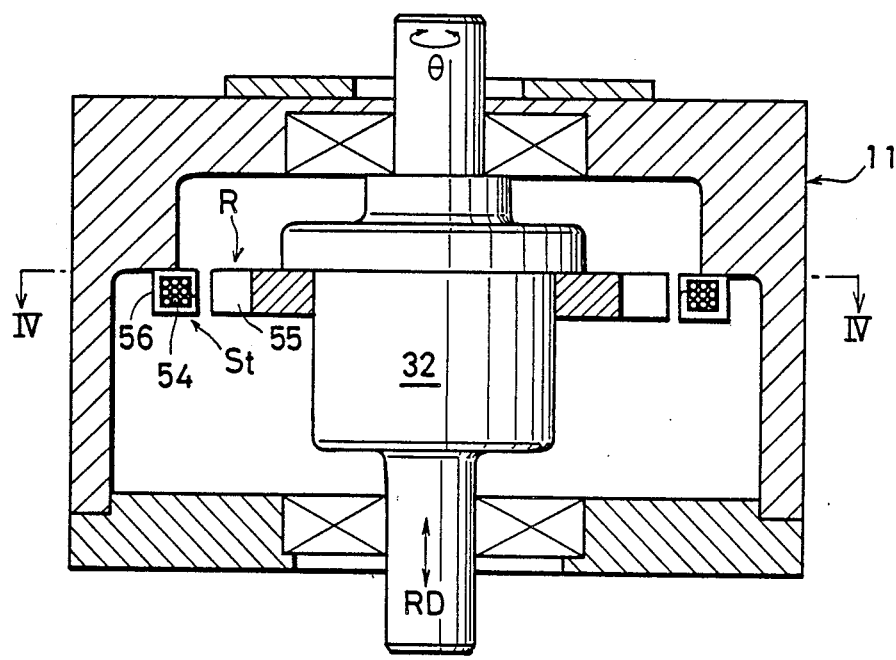
FIGS. 23 to 25 illustrate a second embodiment of the present invention.
Figure 24:
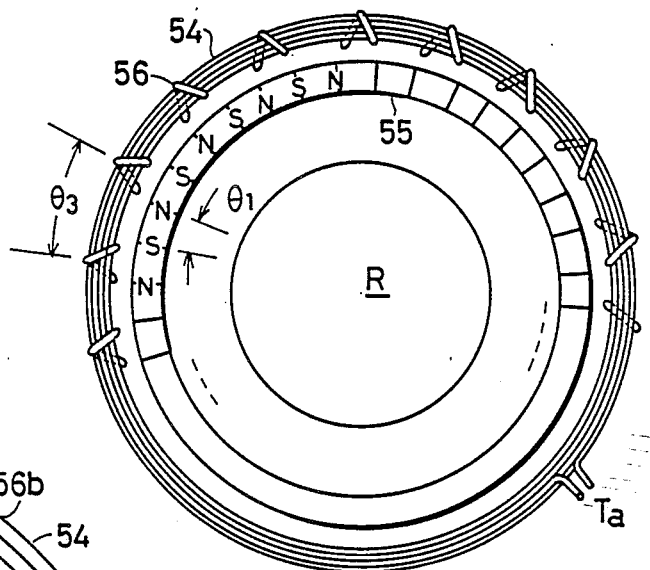
Figure 25:
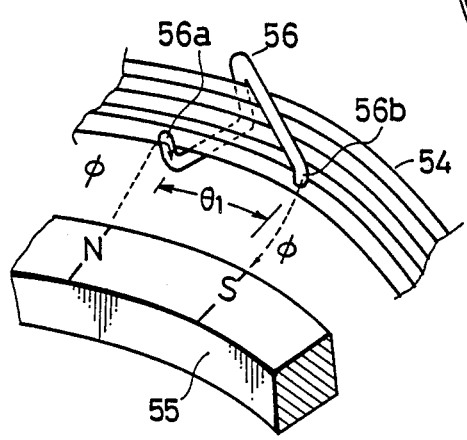

FIG. 23 shows a second embodiment of the present invention, and FIG. 24 is a sectional view taken along the line IV—IV in FIG. 24. A stator $S_t$ is formed by successively winding a plurality of amorphous magnetic cores 56 around coils 54 arrayed concentrically with a rotator R at an angle pitch $\theta_3 = 2\theta$, i.e., twice a magnetization pitch $\theta_1$ of a multipole magnet 55. As shown in FIG. 25, each magnetic core 56 is so wound as to substantially go round the coil 54 in this embodiment. Both end portions 56a and 56b of the magnetic cores 56 are separated by the angle pitch $\theta_1$ from each other to be faced to the outer periphral surface of the multipole magnet 55. In this case, a magnetic flux $\phi$ from an N pole of the multipole magnet 55 reaches, for example, the end 56a of the magnetic core 56 and passes through the magnetic core 56 to return to an S pole from the other end 56a. Thus, inductances of the coils 54 are changed in response to the total sum of the magnetic fields passing through the magnetic cores 56. In other words, the coils 54 are relatively wound around the magnetic cores 56 in this embodiment, and the same are not necessarily wound around the magnetic cores 56.

Since the magnetic cores 56 are arrayed at the angle pitch $\theta_3 = 2\theta_1$, the inductances thereof are increased/decreased in the same directions by the magnetic fields applied from the multipole magnet 55. Further, since the coils 54 are wound in a series manner around the magnetic cores 56, influences of the magnetic fields exerted on the magnetic cores 56 are observed in a superposed manner at a terminal $T_a$ of the coils 54.

This embodiment is simpler in structure than the first embodiment as hereinabove described, whereby an encoder can be readily manufactured according to this embodiment. The array angle pitch for the magnetic cores 56 in FIG. 24 may be arbitrary even times of the magnetic pole pitch $\theta_1$. However, it is to be noted that detection accuracy is improved with reduction in the array pitch of the magnetic cores.

Although one multipole magnet 55 and one stator $S_{t1}$ are provided in FIG. 23, two or more such members may be provided similarly to the first embodiment, thereby to observe inductance change amounts 180° or 90° out of phase with each other. However, the rotation angle of the rotator can be detected also in the structure as shown in FIG. 23 by providing a circuit for detecting inductance change.

C. Third Embodiment

FIG. 26 to 29 illustrate a third embodiment of the present invention. As hereinabove illustrated, a plurality of magnetic field detecting coils are preferably provided to obtain multiphase output, in order to highly precisely perform angle detection. To this end, the first embodiment (FIG. 3) is provided with the two stators $S_{t1}$ and $S_{t2}$ as well as the two multipole magnets 26 and 27 in correspondence thereto.

Figure 26:
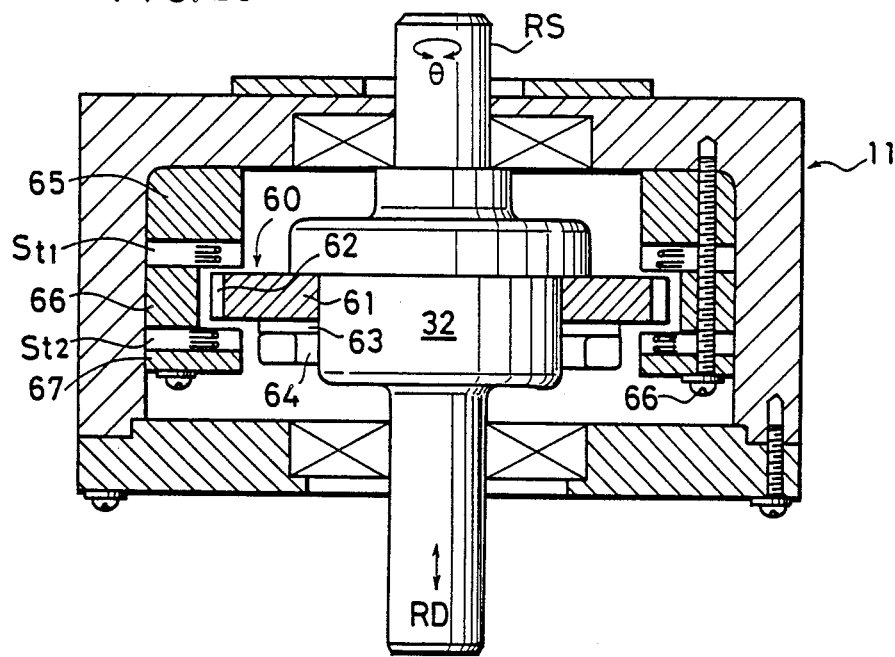
FIGS. 26 to 30 illustrate a third embodiment of the present invention and a modification thereof.

However, an encoder applied to an industrial robot or the like is preferably as lightweight/small as possible, and hence it is desirable to obtain multiphase output with a smaller number of multipole magnet. The third embodiment as hereafter described is directed to solve such a problem. Referring to FIG. 26, a rotor R is formed by fixing a single multipole magnet 62 to the outer periphery of a substantially flat-circular resin holder 61 and fixing the both members to a rotor mounting portion 32 by a washer 63 and a bolt 64 of non-magnetic substance.

This encoder is further provided in positions separated from the upper and lower surfaces of the multipole magnet 62 by prescribed intervals (e.g., 1 mm) with two stators $S_{t1}$ and $S_{t2}$ which are faced to the multipole magnet 62. These stators $S_{t1}$ and $S_{t2}$ are successively laminated with ring-shaped holders 65 to 67 of resin, to be fixed to a casing 11 by small screws 66.

Figure 27:
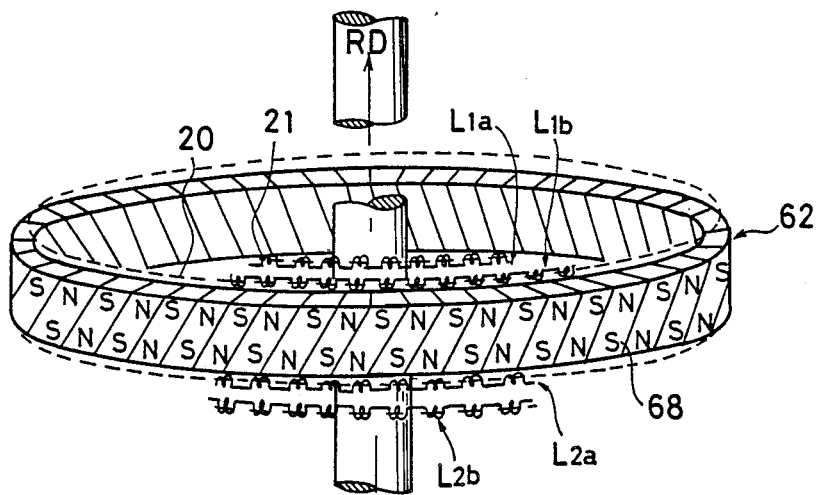
Figure 28:
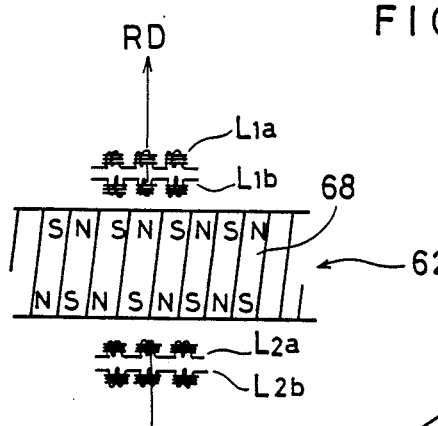

Detailed description is now made on the structure of the multipole magnet 62 and the stators $S_{t1}$ and $S_{t2}$. As shown in FIGS. 27 and 28, the multipole magnet 62 is formed by arraying 100 unit magnets 68 in a condition inclined with respect to the direction RD of the axis of rotation in the form of a ring with alternate array of N and S poles and closely adhering the same to each other. It is to be noted that the 100 unit magnets 68 are only partially shown in FIGS. 27 and 28 for convenience of illustration. Therefore, the alternate array of the N and S poles in the upper part of the multipole magnet 62 is different from that in the lower part by prescribed phases response to the angle of inclination of the unit magnets 68. The said angle of inclination is so selected as to cause 90° phase shift between the upper and lower parts according to this embodiment. For example, magnetic pole boundaries of the lower part are positioned directly under the N poles of the upper part.

On the other hand, each of the stators $S_{t1}$ and $S_{t2}$ is provided with 100 magnetic cores 20 of two stages along the circumferential direction of the rotor R. The magnetic cores 20 are formed by groups of zero-magnetostrictive amorphous element wires having low hysteresis magnetization characteristics similarly to the first embodiment, and arrayed at a pitch identical to the magnetic pole array pitch in the multipole magnet 62. Coils 21 are wound around the magnetic cores 20 in reverse directions between each pair of magnetic cores 20 adjacent in the circumferential direction, though not obvious from the drawings.

Figure 29:
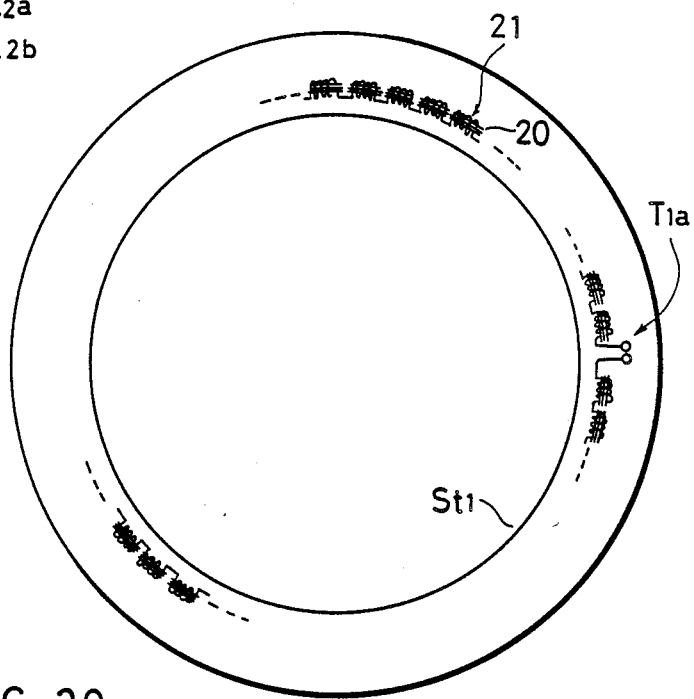

The two-stage coils 21 in the stators $S_{t1}$ and $S_{t2}$ are connected in a series manner per stage, to form coil trains $L_{a1}$, $L_{1b}$, $L_{2a}$ and $L_{2b}$ respectively, as shownin FIGS. 27 and 29.

The coils 21 in the coil trains $L_{1a}$ and $L_{1b}$ are wound around the magnetic cores 20 in winding rules reverse to each other. This also applies to the other two coil trains $L_{2a}$ and $L_{2b}$. Thus, inductance changes 180° out of phase with each other are observed from the coil trains $L_{1a}$ and $L_{1b}$ while inductance changes 90° out of phase are obserbed between the group of the coil trains $L_{1a}$ and $L_{1b}$ and that of the coil trains $L_{2a}$ and $L_{2b}$. In other words, desired multiphase output can be obtained with the single multipole magnet 62 and the magnetic coils 20 arrayed in the same position, by simply inclining the unit magnets 68 with respect to the rotation axis direction RD.

Although the unit magnets 68 of the multipole magnet 62 are closely adhered to each other in this embodiment, the same may be appropriately provided with slits etc. However, it is to be noted that the unit magnets 68 are preferably in close contact with each other to prevent demagnetization. Further, the unit magnets 68 may be coupled with each other by screws, or an inclined multipole magnet 62 may be formed by magnetization.

Figure 30:
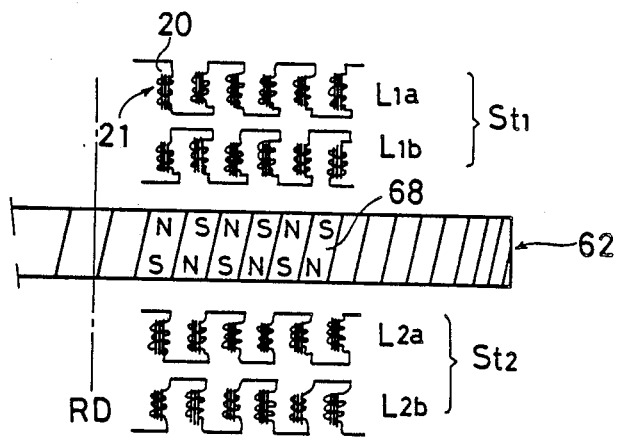

FIG. 30 illustrates a modification of the third embodiment, in which magnetic cores 20 are arrayed in parallel with a rotation axis direction RD. Coils 21 are wound along the magnetic cores 20 entirely in the same direction. Within four coil trains $L_{1a}$, $L_{1b}$, $L_{2a}$ and $L_{2b}$, the coil trains $L_{1a}$ and $L_{2a}$ are formed by alternately connecting the coils 21 belonging thereto along the same rule. The other two coil trains $L_{1b}$ and $L_{2b}$ are formed by alternately connecting the coils 21 belonging thereto along a rule reverse to the rule in the coil trains $L_{1a}$ and $L_{2a}$. Unit magnets 68 of a multipole magnet 62 are inclined identically to those in the third embodiment. Thus, inductance changes 180° out of phase with each other are caused in the coil trains $L_{1a}$ and $L_{1b}$ while inductance changes 90° out of phase with those of the coil trains $L_{1a}$ and $L_{1b}$ are caused in the coil trains $L_{2a}$ and $L_{2b}$.

The various modifications as hereinabove described with reference to the first and second embodiments are also applicable to the third embodiment, as a matter of course.

D. Magnetic Field Adjusting Method

Figure 31:
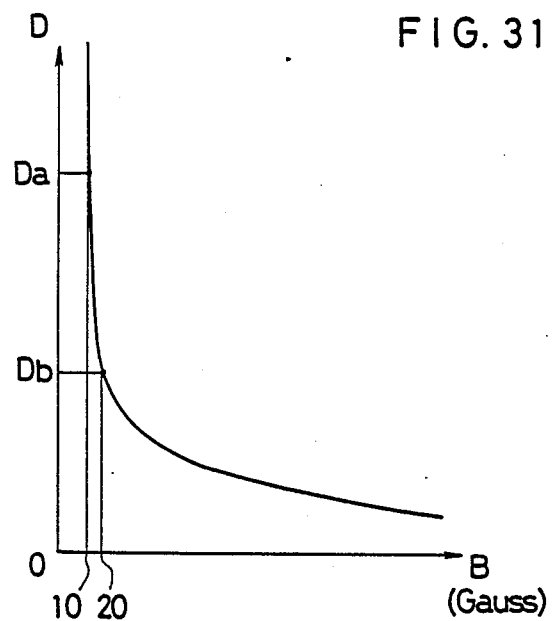
FIG. 31 is a graph showing the principle of magnetic field adjustment.

Description is now made on method of adjusting magnetic fields in the encoder according to the present invention. As hereinabove described, magnetic field sensors have specific magnetic field detecting characteristics, and preferably magnetic fields are so generated in positions of the magnetic field sensors as to most effectively facilitate magnetic detecting abilities of the sensors in a magnetic encoder. In the case of the amorphous magnetic cores 20 as shown in FIG. 8, for example, magnetization characteristics corresponding to the linear portion $B_L$ at FIG. 9(a) are obtained upon application of magnetic fields of 10 to 20 gauss, whereby the detecting abilities thereof are maximized. Therefore, when dependency of magnetic fluxes (magmetic flux density: B) on a distance D between each magnetic pole of a multipole magnet and each magnetic core 20 is as shown in FIG. 31, the said distance D must be within a range $D_b < D < D_a$ corresponding $10$ gauss $< B < 20$ gauss. Thus, the gap G between the multipole magnet and the magnetic cores is 3 mm in each of the aforementioned embodiments. However, since it is difficult to completely prevent errors in finished sizes etc. of stators, and such setting of the gap G is not necessarily sufficient. Therefore, adjustment is required in order to obtain optimum magnetic fields.

Figure 32:
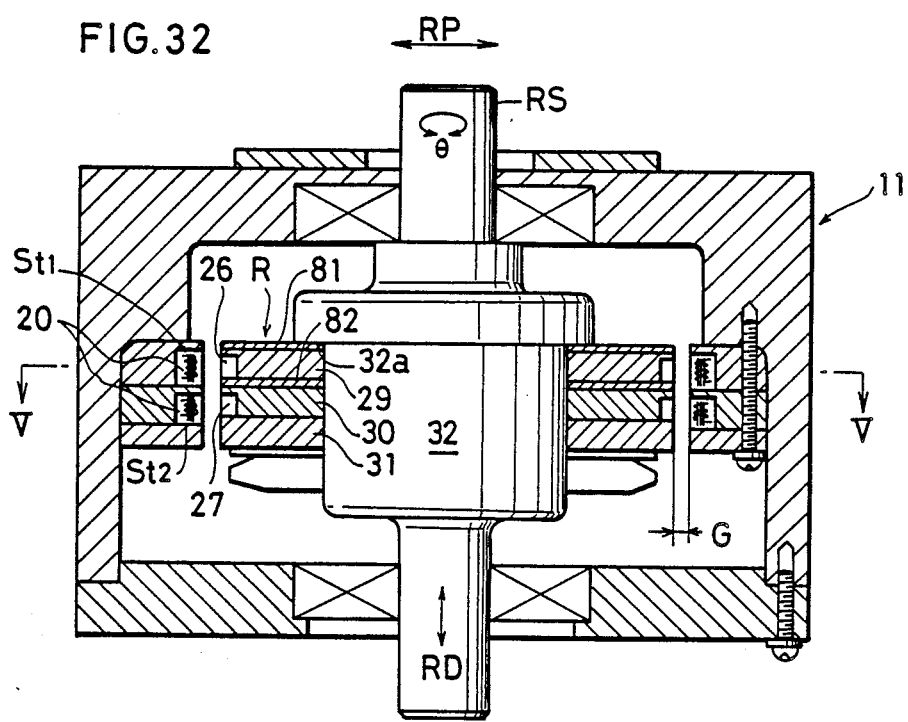
FIG. 32 illustrates an example of an encoder capable of adjusting magnetic fields.

FIG. 32 shows an example of an encoder capable of such magnetic field adjustment, and the encoder is merely partially different from that of the first embodiment as shown in FIG. 3. The different points are as follows:

In the encoder as shown in FIG. 32, a section taken along the line V—V is similar to that shown in FIG. 17, such that multipole magnets 26 and 27 are alternately magnetized toward a rotation axis direction RD. Further, magnetic cores 20 are arrayed also toward the rotation axis direction RD. However, such portions are not essentially different from those in other embodiments, and the structure is merely selected from various modes.

Figure 33:
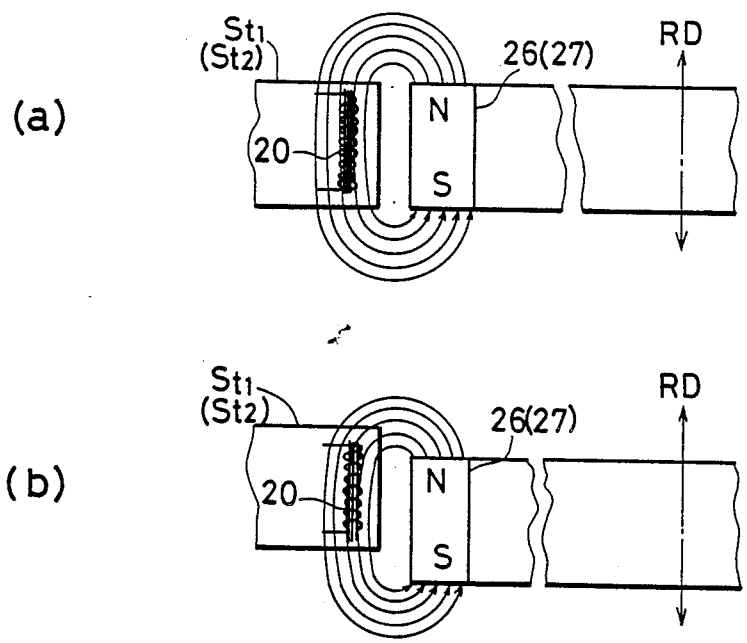
FIGS. 33 and 34 are explanatory diagrams of a method of adjusting magnetic fields.

Second, flat spacers 81 and 82 of resin are laminated with resin holders 29 and 30 holding stators $S_{t1}$ and $S_{t2}$ and engaged with a contact surface 32a of a rotor mounting portion 32. As obvious from FIG. 32, the resin spacers 81 and 82 may be varied in thickness to change relative distance between the multipole magnets 26 and 27 and the magnetic cores 20 along the rotation axis direction RD. Such circumstances are shown in FIG. 33, from which it is understood that the magnetic fields are varied in strength in the positions of the magnetic cores 20 by moving the positions of the multipole magnets 26 and 27 along the rotation axis direction RD. The magnetic fields are maximized in strength when the multipole magnets 26 and 27 completely face the magnetic cores 20 as shown in FIG. 33(a).

When the magnetic poles or the stators $S_{t2}$ are moved in a parallel manner along a direction RP (FIG. 32) perpendicular to the rotation axis direction RD to adjust the distance between the magnetic poles and the magnetic cores, the gap G cannot remain uniform along the full circumference. According to this embodiment, therefore, the magnetic poles are moved toward the rotation axis direction RD to substantially change the mutual distance between the magnetic poles and the magnetic cores, thereby to adjust the magnetic fields.

Figure 34:
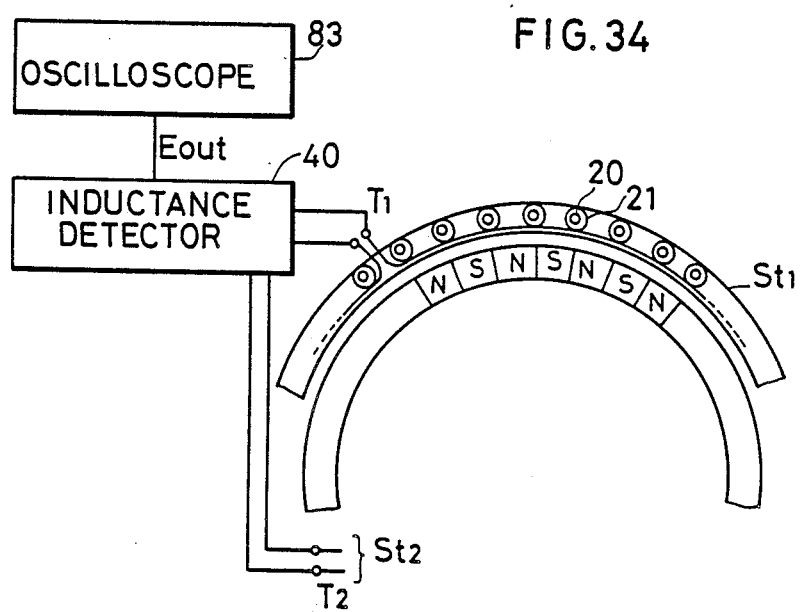

Description is now made on the manner of setting the thickness of the spacers 81 and 82. First, the spacers 81 and 82 are prepared in arbitrary thickness, to be laminated with the resin holders 29 and 30 and mounted on the rotor mounting portion 32. Then, as shown in FIG. 34, coil terminals $T_1$ and $T_2$ of the two stators $S_{t1}$ and $S_{t2}$ are connected to an inductance detector 40, which is in structure identical to that shown in FIG. 11. Output $E_{out}$ from the inductance detector 40 is supplied to an oscilloscope 83.

Upon such connection, the rotor R is driven to rotate, whereby a sinusoidal signal is generated as the detecting output $E_{out}$, as hereinabove described. The waveform is desplayed on the oscilloscope 83, for observation of the amplitude of the sinusoidal waves and conditions of linearity of the detecting output with respect to the rotation angle.

Then the rotation of the rotor R is stopped to replace the resin spacers 81 and 82 by those of different thickness. Thereafter the amplitude and the waveform of the detecting output $E_{out}$ are observed similarly to the above.

Such operation is repeated on the spacers 81 and 82 varied in thickness, to determine such thickness of the spacers 81 and 82 that the amplitude of the detecting output $E_{out}$ is maximized and the linearity thereof is most improved. Thus, the spacers 81 and 82 in optimum thickness are employed and fixed to adjust the distance between the multipole magnets 26 and 27 and the magnetic cores 20 included in the stators $S_{t1}$ and $S_{t2}$, thereby to adjust the magnetic fields at the postions of the magnetic cores 20.

Although the spacers 81 and 82 are varied in thickness according to this embodiment, the holders 29 and 30 may be provided in a screwed manner to adjust positions thereof in the rotation axis direction RD. Further, positions of the stators $S_{t1}$ and $S_{t2}$ may be varied by spacers or the like.

E. Supplement

The present invention is also applicable to a linear encoder and the like, in addition to the rotary encoder. The magnetic poles may be provided in the stator side while the magnetic cores and coils for magnetic detection may be provided in the rotor side. Although the magnetic cores are most preferably made from zeromagnetstrictive amorphous having low hysteresis magnetization characteristics, the same may be prepared by any other material on condition that hysteresis thereof is low.

The resin holders etc. may be replaced by those of various materials such as electrically insulative non-magnetic substance. Further, the coils are not necessarily sealed by resin, but may be fixed by any method.

According to the present invention as hereinabove described, the magnetic field sensor side is improved in accuracy, whereby position (angle) detecting output of high resolution can be obtained without reducing the gap between the rotator and the stators.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An encoder having a stator and a movable element facing each other for magnetically detecting relative positional relation between said stator and said movable element, said encoder comprising:
   multipole magnetic field generating means provided in one of said movable element and said stator; and
   magnetic field detecting means provided in the other of said stator and said movable element and facing said multipole magnetic field generating means,
   said magnetic field detecting means having a plurality of magnetic cores formed by a magnetic substance having magnetization characteristics with low hysteresis and arrayed at a pitch corresponding to a magnetic pole pitch in said multipole magnetic field generating means, and magnetic field detecting coils extended across respective ones of said plurality of magnetic cores to be magnetically coupled with said plurality of magnetic cores.

2. An encoder in accordance with claim 1, wherein said magnetic cores are formed by magnetic substance having angular magnetization characteristics.

3. An encoder in accordance with claim 2, wherein said magnetic cores are amorphous magnetic cores.

4. An encoder in accordance with claim 1, wherein said movable element comprises a rotor.

5. An encoder in accordance with claim 4, wherein said multipole magnetic field generating means comprises a ring-shaped magnetic member with N poles and S poles disposed alternately along the circumference thereof, and
   said magnetic cores comprise axial core portions radially oriented toward an axis of rotation of said rotor.

6. An encoder in accordance with claim 4, wherein said multipole magnetic field generating means is formed by magnetizing a rig-shaped magnetic member with N poles and S poles alternately along the circumference thereof on a direction perpendicular to said circumference, and
   said magnetic cores are so arrayed that the axial directions thereof are parallel to N-S directions of said magnetic poles.

7. An encoder in accordance with claim 4, wherein said multipole magnetic field generating means comprises:
   magnetic field generating coils wound about the rotation axis of said rotor, and
   L-shaped magnetic members alternately extending from upper and lower side surfaces of said magnetic field generating coils along the circumferential direction of said magnetic field generating coils.

8. An encoder in accordance with claim 4, wherein said magnetic field detecting means comprises:
   coils wound in the side of said stator about the rotation axis of said rotor, and
   array of a plurality of magnetic cores wound around said coils.

9. An encoder in accordance with claim 4, wherein said stator have said magnetic cores and said magnetic field detecting coils, and
   said rotor has ring-shaped multipole magnetic field generating means and a holder fixed to a rotor shaft to hold said ring-shaped multipole magnetic field generating means.

10. An encoder in accordance with claim 4, wherein said multipole magnetic field generating means is provided in a plane perpendicular to the rotation axis direction of said rotor,
    said magnetic field detecting means has a plurality of magnetic field detecting coils provided on both of upper and lower surface sides of said multipole magnetic field generating means, and
    said multipole magnetic field generating means has array of magnetic poles inclined by a prescribed angle with respect to said rotation axis direction to be successively and alternately polarized as N-S and S-N.

11. An encoder in accordance with claim 1, wherein said magnetic field detecting coils comprise a series connection of a plurality of individual coils respectively wound around said plurality of magnetic cores.

12. An encoder in accordance with claim 1, wherein said magnetic field detecting coils comprise a connection of a plurality of individual coils respectively wound in a wave-winding manner around said plurality of magnetic cores.

13. An encoder in accordance with claim 1, wherein a plurality of said magnetic field detecting means are provided thereby to obtain detection outputs of two or more phases from said encoder.

14. An encoder in accordance with claim 5, wherein said magnetic field detecting coils comprise a series connection of a plurality of individual coils respectively wound around said plurality of magnetic cores.

15. An encoder in accordance with claim 5, wherein said magnetic field detecting coils comprise a connection of a plurality of individual coils respectively wound in a wave-winding manner around said plurality of magnetic cores.

16. An encoder in accordance with claim 1, wherein said magnetic substance comprises a plurality of wires each formed of a magnetostrictive amorphous ferromagnetic substance having substantially zero hysteresis in a magnetization process.

17. An encoder in accordance with claim 16 wherein said wires forming said cores have diameters substantially equal to 0.1 mm and lengths substantially equal to 4 mm.

18. An encoder in accordance with claim 1 wherein said multipole magnetic field generating means and said magnetic field detecting means facing said multipole magnetic field generating means each comprises a disc shaped annular structure, said multipole magnetic field generating means and said magnetic field detecting means radially separated by an annular air gap therebetween.

19. An encoder in accordance with claim 18 wherein said magnetic cores forming said magnetic field detecting means are arrayed along a ring portion of said annular structure of said magnetic field detecting means, said disc shaped annular structures forming said magnetic field generating means and said magnetic field detecting means being radially disposed relative to one another, said magnetic cores oriented radially relative to said disc shaped annular structures.

20. An encoder in accordance with claim 19 wherein said annular structure of said magnetic field detecting means surrounds said annular structure of said magnetic field generating means, said annular structure of said magnetic field generating means rotatable about an axis within a region circumscribed by said magnetic field detecting means.

21. An encoder in accordance with claim 18 wherein said disc shaped annular structure forming said magnetic field generating means comprises a pair of multipole magnetic discs axially displaced from and attached to one another and said disc shaped annular structure forming said magnetic field detecting means comprises a pair of discs axially displaced from and attached to one another.

22. An encoder in accordance with claim 21 wherein each of said pair of discs forming said magnetic field detecting means comprises a plurality of said magnetic cores uniformly distributed along a ring shaped portion thereof, said plurality of magnetic cores spaced apart from one another by said magnetic pole pitch of said multipole magnetic field generating means.

23. An encoder in accordance with claim 18 wherein said disc forming said magnetic field detecting means comprises a plurality of said magnetic cores uniformly distributed along a ring shaped portion thereof, said plurality of magnetic cores spaced apart from one another by said magnetic pole pitch of said multipole magnetic field generating means.

24. An encoder in accordance with claim 23 wherein said plurality of said magnetic cores comprises a number of cores substantially equal to a corresponding number of poles of said multipole magnetic field generating means.

* * * * *